(12) United States Patent
Katayama et al.

(10) Patent No.: US 6,693,977 B2
(45) Date of Patent: Feb. 17, 2004

(54) PORTABLE RADIO DEVICE WITH DIRECT CONVERSION RECEIVER INCLUDING MIXER DOWN-CONVERTING INCOMING SIGNAL, AND DEMODULATOR OPERATING ON DOWNCONVERTED SIGNAL

(75) Inventors: Hiroshi Katayama, Yokohama (JP); Katsuaki Abe, Kawasaki (JP); Yasumi Imagawa, Kanazawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 346 days.

(21) Appl. No.: 09/855,613

(22) Filed: May 16, 2001

(65) Prior Publication Data

US 2001/0021234 A1 Sep. 13, 2001

Related U.S. Application Data

(63) Continuation of application No. 09/070,154, filed on Apr. 30, 1998, now Pat. No. 6,275,542.

(30) Foreign Application Priority Data

May 13, 1997 (JP) .............................................. 9-122292

(51) Int. Cl.[7] ................................................ H03D 3/00
(52) U.S. Cl. ........................................................ 375/322
(58) Field of Search ................................ 375/259, 285, 375/316, 322, 344, 346, 350; 455/266

(56) References Cited

U.S. PATENT DOCUMENTS

| | | | |
|---|---|---|---|
| 5,012,490 A | 4/1991 | Myer | 375/285 |
| 5,511,235 A | 4/1996 | Duong et al. | 455/75 |
| 5,604,927 A | 2/1997 | Moore | 455/266 |
| 5,822,373 A | 10/1998 | Addy | 375/259 |
| 6,134,282 A | 10/2000 | Ben-Efraim et al. | 375/350 |
| 6,275,542 B1 * | 8/2001 | Katayama et al. | 375/322 |

FOREIGN PATENT DOCUMENTS

JP 6-54005 2/1994

OTHER PUBLICATIONS

Simon Haykin, Communications Systems, John Wiley & Sons, New York, 1994, pp. 139–140.

* cited by examiner

Primary Examiner—Don N. Vo
(74) Attorney, Agent, or Firm—Clark & Brody (57) ABSTRACT

A direct conversion receiver includes a local oscillator for generating a first local oscillator signal having a variable frequency. A 90° phase shifter operates for shifting a phase of the first local oscillator signal by 90° to convert the first local oscillator signal into a second local oscillator signal. A first mixer operates for mixing a received RF signal and the first local oscillator signal. A second mixer operates for mixing the received RF signal and the second local oscillator signal. A first low pass filter processes an output signal of the first mixer. The first low pass filter has a controllable cutoff frequency. A second low pass filter processes an output signal of the second mixer. The second low pass filter has a controllable cutoff frequency. A demodulator recovers an information signal represented by the received RF signal from output signals of the first and second low pass filters. A frequency error detector operates for detecting an error between a frequency of a carrier of the received RF signal and the frequency of the first local oscillator signal in response to the information signal recovered by the demodulator. An oscillator controller operates for controlling the frequency of the first local oscillator signal in response to the error detected by the frequency error detector. A filter controller operates for controlling the cutoff frequencies of the first and second low pass filters in response to the error detected by the frequency error detector.

5 Claims, 8 Drawing Sheets

PORTABLE RADIO DEVICE WITH DIRECT CONVERSION RECEIVER INCLUDING MIXER DOWN-CONVERTING INCOMING SIGNAL, AND DEMODULATOR OPERATING ON DOWNCONVERTED SIGNAL

This is a continuation of Ser. No. 09/070,154 filed on Apr. 30, 1998, now U.S. Pat. No. 6,275,542 issued on Aug. 14, 2001.

BACKGROUND OF THE INVENTION

1. Field of the Invention

This invention relates to a direct conversion receiver which can be used in a mobile communication apparatus such as a PHS (Personal Handy Phone) telephone set, a portable telephone set, or a pager.

2. Description of the Related Art

Japanese published unexamined patent application 6-54005 discloses a direct conversion receiver having an FSK (frequency shift keying) demodulator. In the direct conversion receiver of Japanese application 6-54005, a received radio-frequency (RF) FSK signal carrying a digital information signal is fed to first and second mixers. The first mixer down-converts the RF FSK signal in response to a first local oscillator signal. The second mixer down-converts the RF FSK signal in response to a second local oscillator signal having a quadrature relation with the first local oscillator signal. The first local oscillator signal is outputted from a voltage controlled oscillator which serves as a local oscillator. A 90° phase shifter converts the first local oscillator signal into the second local oscillator signal. The output signal of the first mixer is processed by a first low pass filter, being converted thereby into a baseband I (in-phase) signal. The output signal of the second mixer is processed by a second low pass filter, being converted thereby into a baseband Q (quadrature) signal. A demodulation circuit recovers the digital information signal from the baseband I signal and the baseband Q signal. The demodulation circuit outputs the recovered digital information signal.

In the direct conversion receiver of Japanese application 6-54005, one of the baseband I signal or the baseband Q signal is converted into a signal voltage by a frequency-to-voltage converter. The signal voltage is compared with a reference voltage by a voltage comparator. An in-phase/opposite phase discrimination circuit compares the phase of the output signal of the voltage comparator and the phase of the output signal of the demodulation circuit to decide whether the phases are equal or opposite to each other. When the phases are equal to each other, the in-phase/opposite phase discrimination circuit outputs a voltage-down signal to a charge pump. When the phases are opposite to each other, the in-phase/opposite phase discrimination circuit outputs a voltage-up signal to the charge pump. The charge pump generates a voltage signal in response to the voltage-up signal and the voltage-down signal outputted from the in-phase/opposite phase discrimination circuit. The voltage signal is transmitted from the charge pump to a control terminal of the voltage controlled oscillator via a low pass filter. Thus, the frequency of the first local oscillator signal and also the frequency of the second local oscillator signal are controlled in response to the voltage signal generated by the charge pump. This frequency control is designed to provide automatic frequency control (AFC) which enables the frequency of the first and second local oscillator signals to automatically follow the carrier frequency (the center frequency) of the received RF FSK signal.

The selectivity of the direct conversion receiver of Japanese application 6-54005 is determined by the cutoff frequency of the first and second low pass filters which follow the first and second mixers. The cutoff frequency of the first and second low pass filters is fixed. Therefore, in the direct conversion receiver of Japanese application 6-54005, it is difficult to automatically adjust the selectivity in response to signal receiving conditions.

As previously explained, the direct conversion receiver of Japanese application 6-54005 has the AFC function of correcting an error between the frequency of the first and second local oscillator signals and the carrier frequency (the center frequency) of a received RF FSK signal. The AFC can not correct a frequency error having a magnitude corresponding to greater than a passband provided by the receiver selectivity. The passband is fixed since the cutoff frequency of the first and second low pass filters and also the receiver selectively are fixed. Thus, in the direct conversion receiver of Japanese application 6-54005, it is difficult to automatically adjust the greater limit of a frequency error which can be corrected by the AFC.

SUMMARY OF THE INVENTION

It is an object of this invention to provide an improved direct conversion receiver.

A first aspect of this invention provides a direct conversion receiver comprising a local oscillator for generating a first local oscillator signal having a variable frequency; a 90° phase shifter connected to the first local oscillator for shifting a phase of the first local oscillator signal by 90° to convert the first local oscillator signal into a second local oscillator signal; a first mixer connected to the local oscillator for mixing a received RF signal and the first local oscillator signal; a second mixer connected to the 90° phase shifter for mixing the received RF signal and the second local oscillator signal; a first low pass filter connected to the first mixer for processing an output signal of the first mixer, the first low pass filter having a controllable cutoff frequency; a second low pass filter connected to the second mixer for processing an output signal of the second mixer, the second low pass filter having a controllable cutoff frequency; a demodulator connected to the first and second low pass filters for recovering an information signal represented by the received RF signal from output signals of the first and second low pass filters; a frequency error detector connected to the demodulator for detecting an error between a frequency of a carrier of the received RF signal and the frequency of the first local oscillator signal in response to the information signal recovered by the demodulator; an oscillator controller connected to the local oscillator and the frequency error detector for controlling the frequency of the first local oscillator signal in response to the error detected by the frequency error detector; and a filter controller connected to the first and second low pass filters and the frequency error detector for controlling the cutoff frequencies of the first and second low pass filters in response to the error detected by the frequency error detector.

A second aspect of this invention is based on the first aspect thereof, and provides a direct conversion receiver wherein the frequency error detector comprises an integrator for integrating a voltage of the information signal over a given time interval longer than a period corresponding to a transmission data rate related to the information signal.

A third aspect of this invention is based on the first aspect thereof, and provides a direct conversion receiver wherein the frequency error detector comprises a peak detector for detecting a peak voltage of the information signal which occurs during a given time interval longer than a period corresponding to a transmission data rate related to the information signal, a valley detector for detecting a valley voltage of the information signal which occurs during the given time interval, and an adder for adding the peak voltage detected by the peak detector and the valley voltage detected by the valley detector.

A fourth aspect of this invention is based on the first aspect thereof, and provides a direct conversion receiver wherein the filter controller comprises means for changing each of the cutoff frequencies of the first and second low pass filters between at least two different values in response to the error detected by the frequency error detector.

A fifth aspect of this invention is based on the first aspect thereof, and provides a direct conversion receiver wherein the filter controller comprises means for continuously varying the cutoff frequencies of the first and second low pass filters in accordance with the error detected by the frequency error detector.

A sixth aspect of this invention provides a direct conversion receiver comprising a local oscillator for generating a first local oscillator signal having a variable frequency; a 90° phase shifter connected to the first local oscillator for shifting a phase of the first local oscillator signal by 90° to convert the first local oscillator signal into a second local oscillator signal; a first mixer connected to the local oscillator for mixing a received RF signal and the first local oscillator signal; a second mixer connected to the 90° phase shifter for mixing the received RF signal and the second local oscillator signal; a first low pass filter connected to the first mixer for processing an output signal of the first mixer, the first low pass filter having a controllable cutoff frequency; a second low pass filter connected to the second mixer for processing an output signal of the second mixer, the second low pass filter having a controllable cutoff frequency; a demodulator connected to the first and second low pass filters for recovering an information signal represented by the received RF signal from output signals of the first and second low pass filters; a frequency error detector connected to the demodulator for detecting an error between a frequency of a carrier of the received RF signal and the frequency of the first local oscillator signal in response to the information signal recovered by the demodulator; an oscillator controller connected to the local oscillator and the frequency error detector for controlling the frequency of the first local oscillator signal in response to the error detected by the frequency error detector; and a signal processor connected to the first and second low pass filters and the demodulator for deciding whether or not a given signal pattern is present in the information signal recovered by the demodulator, and for controlling the cutoff frequencies of the first and second low pass filters in response to a result of the deciding.

A seventh aspect of this invention provides a direct conversion receiver comprising a local oscillator for generating a local oscillator signal; a mixer connected to the local oscillator for mixing a received RF FSK signal and the local oscillator signal; a low pass filter connected to the mixer for processing an output signal of the mixer, the low pass filter having a changeable cutoff frequency; first means for detecting an error between a frequency of a carrier of the received RF FSK signal and a frequency of the local oscillator signal; and second means connected to the low pass filter and the first means for changing the cutoff frequency of the low pass filter in response to the error detected by the first means.

An eighth aspect of this invention is based on the seventh aspect thereof, and provides a direct conversion receiver further comprising third means connected to the local oscillator and the first means for controlling a frequency of the local oscillator signal in response to the error detected by the first means.

A ninth aspect of this invention provides a direct conversion receiver comprising a local oscillator for generating a local oscillator signal; a mixer connected to the local oscillator for mixing a received RF FSK signal and the local oscillator signal; a low pass filter connected to the mixer for processing an output signal of the mixer, the low pass filter having a changeable cutoff frequency; a demodulator connected to the low pass filter for recovering an information signal represented by the received RF FSK signal from an output signal of the low pass filter; and a signal processor connected to the low pass filter and the demodulator for deciding whether or not a given signal pattern is present in the information signal recovered by the demodulator, and for changing the cutoff frequency of the low pass filter in response to a result of the deciding.

A tenth aspect of this invention is based on the ninth aspect thereof, and provides a direct conversion receiver further comprising first means for detecting an error between a frequency of a carrier of the received RF FSK signal and a frequency of the local oscillator signal, and second means connected to the local oscillator and the first means for controlling the frequency of the local oscillator signal in response to the error detected by the first means.

DESCRIPTION OF THE PREFERRED EMBODIMENTS

A prior-art direct conversion receiver will be explained hereinafter for a better understanding of this invention.

Figure 1:
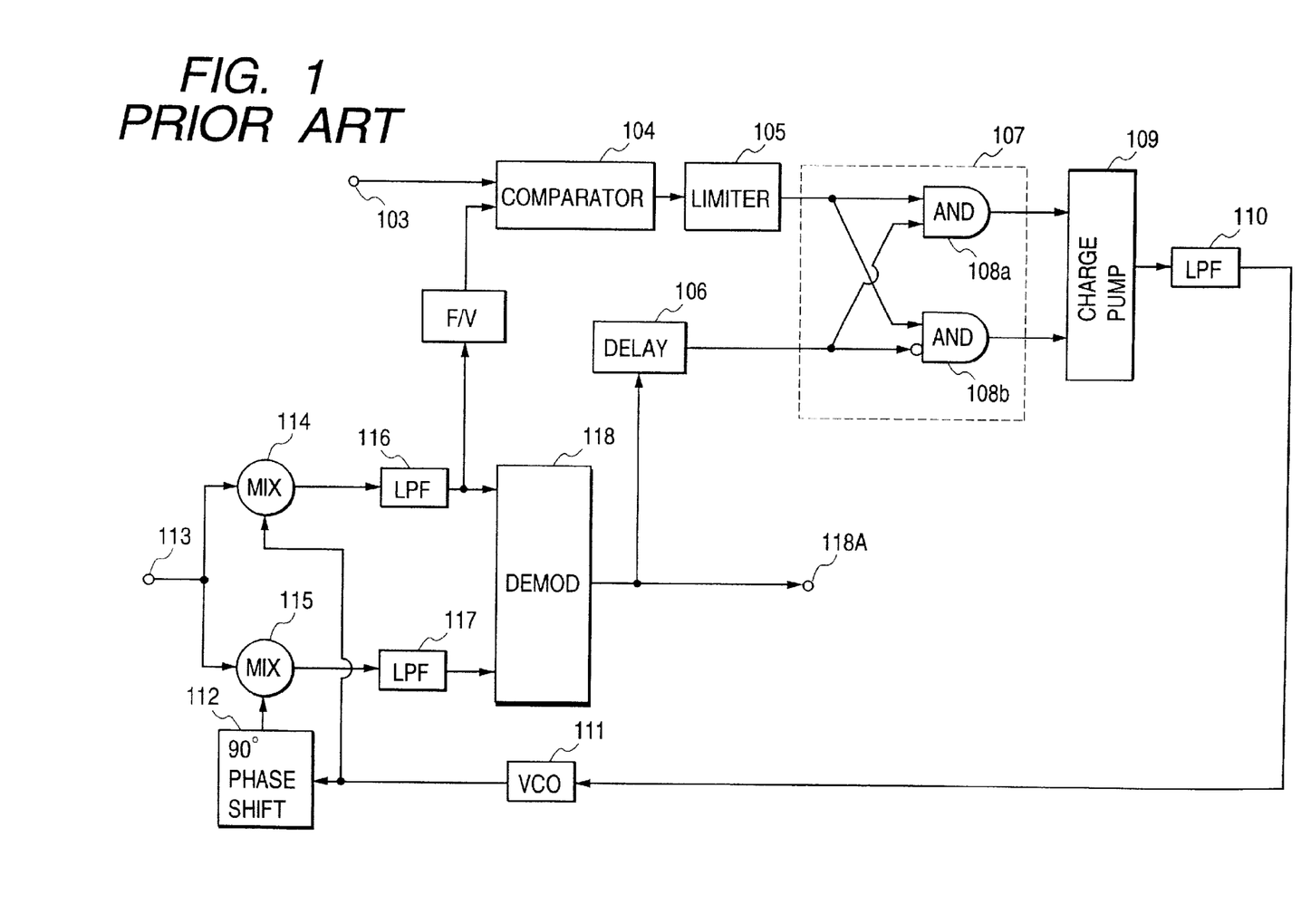
FIG. 1 is a block diagram of a prior-art direct conversion receiver.

FIG. 1 shows a prior-art direct conversion receiver disclosed in Japanese published unexamined patent application 6-54005. The prior-art direct conversion receiver of FIG. 1 includes first and second mixers 114 and 115 which receive an RF FSK signal via an input terminal 113. The RF FSK signal carries a digital information signal.

The first mixer 114 down-converts the received RF FSK signal in response to a first local oscillator signal. The second mixer 115 down-converts the received RF FSK signal in response to a second local oscillator signal having a quadrature relation with the first local oscillator signal. The first local oscillator signal is generated by a voltage controlled oscillator 111 which serves as a local oscillator. The first local oscillator signal is fed from the voltage controlled oscillator 111 to the first mixer 114. A 90° phase shifter 112 receives the first local oscillator signal from the voltage controlled oscillator 111. The 90° phase shifter 112 converts the first local oscillator signal into the second local oscillator signal. The 90° phase shifter 112 feeds the second local oscillator signal to the second mixer 115.

The output signal of the first mixer 114 is processed by a first low pass filter 116, being converted thereby into a baseband I (in-phase) signal. The output signal of the second mixer 115 is processed by a second low pass filter 117, being converted thereby into a baseband Q (quadrature) signal. A demodulation circuit 118 receives the baseband I signal and the baseband Q signal from the low pass filters 116 and 117. The demodulation circuit 118 recovers the digital information signal from the baseband I signal and the baseband Q signal. The recovered digital information signal is transmitted from the demodulation circuit 118 to an external device (not shown) via an output terminal 118A.

In the prior-art direct conversion receiver of FIG. 1, a frequency-to-voltage converter 102 receives the baseband I signal from the low pass filter 116. The frequency-to-voltage converter 102 changes the baseband I signal into a corresponding signal voltage. The frequency-to-voltage converter 102 applies the signal voltage to a first input terminal of a voltage comparator 104. A reference voltage is applied to a second input terminal of the voltage comparator 104 via an input terminal 103. The device 104 compares the signal voltage with the reference voltage, thereby converting the signal voltage into a bi-level signal (a binary signal). The voltage comparator 104 outputs the bi-level signal to a limiter amplifier 105. The limiter amplifier 105 subjects the output signal of the voltage comparator 104 to an amplitude limiting process. The limiter amplifier 105 outputs the resultant binary signal to a first input terminal of an AND circuit 108a and also a first input terminal of an AND circuit 108b.

The demodulation circuit 118 outputs the recovered digital information signal to a delay circuit 106. The delay circuit 106 defers the digital information signal by a predetermined time. The delay circuit 106 outputs the resultant digital signal to a second input terminal of the AND circuit 108a. The delay circuit 106 feeds the resultant digital signal to a second input terminal of the AND circuit 108b via a NOT circuit or an inverter (no reference numeral). The AND circuits 108a and 108b are combined to form an in-phase/opposite phase discrimination circuit 107. The in-phase/opposite phase discrimination circuit 107 compares the phase of the output signal of the limiter amplifier 105 and the phase of the output signal of the delay circuit 106 to decide whether the phases are equal or opposite to each other. When the phases are equal to each other, the in-phase/opposite phase discrimination circuit 107 outputs a voltage-down signal to a charge pump 109. Specifically, the AND circuit 108b outputs the voltage-down signal to the charge pump 109. When the phases are opposite to each other, the in-phase/opposite phase discrimination circuit 107 outputs a voltage-up signal to the charge pump 109. Specifically, the AND circuit 108a outputs the voltage-up signal to the charge pump 109. The charge pump 109 generates a voltage signal in response to the voltage-up signal and the voltage-down signal outputted from the in-phase/opposite phase discrimination circuit. The voltage of the signal generated by the charge pump 109 is decreased and increased by the voltage-down signal and the voltage-up signal, respectively. The voltage signal is transmitted from the charge pump 109 to a control terminal of the voltage controlled oscillator 111 via a low pass filter 110. Thus, the frequency of the first local oscillator signal and also the frequency of the second local oscillator signal are controlled in response to the voltage signal generated by the charge pump 109. This frequency control is designed to provide automatic frequency control (AFC) which enables the frequency of the first and second local oscillator signals to automatically follow the carrier frequency (the center frequency) of the received RF FSK signal.

The selectivity of the prior-art direct conversion receiver of FIG. 1 is determined by the cutoff frequency of the first and second low pass filters 116 and 117 which follow the first and second mixers 114 and 115. The cutoff frequency of the first and second low pass filters 116 and 117 is fixed. Therefore, in the prior-art direct conversion receiver of FIG. 1, it is difficult to automatically adjust the selectivity in response to signal receiving conditions.

As previously explained, the prior-art direct conversion receiver of FIG. 1 has the AFC function of correcting an error between the frequency of the first and second local oscillator signals and the carrier frequency (the center frequency) of a received RF FSK signal. The AFC can not correct a frequency error having a magnitude corresponding to greater than a passband provided by the receiver selectivity. The passband is fixed since the cutoff frequency of the first and second low pass filters 116 and 117 and also the receiver selectively are fixed. Thus, in the prior-art direct conversion receiver of FIG. 1, it is difficult to automatically adjust the greater limit of a frequency error which can be corrected by the AFC.

First Embodiment

Figure 2:
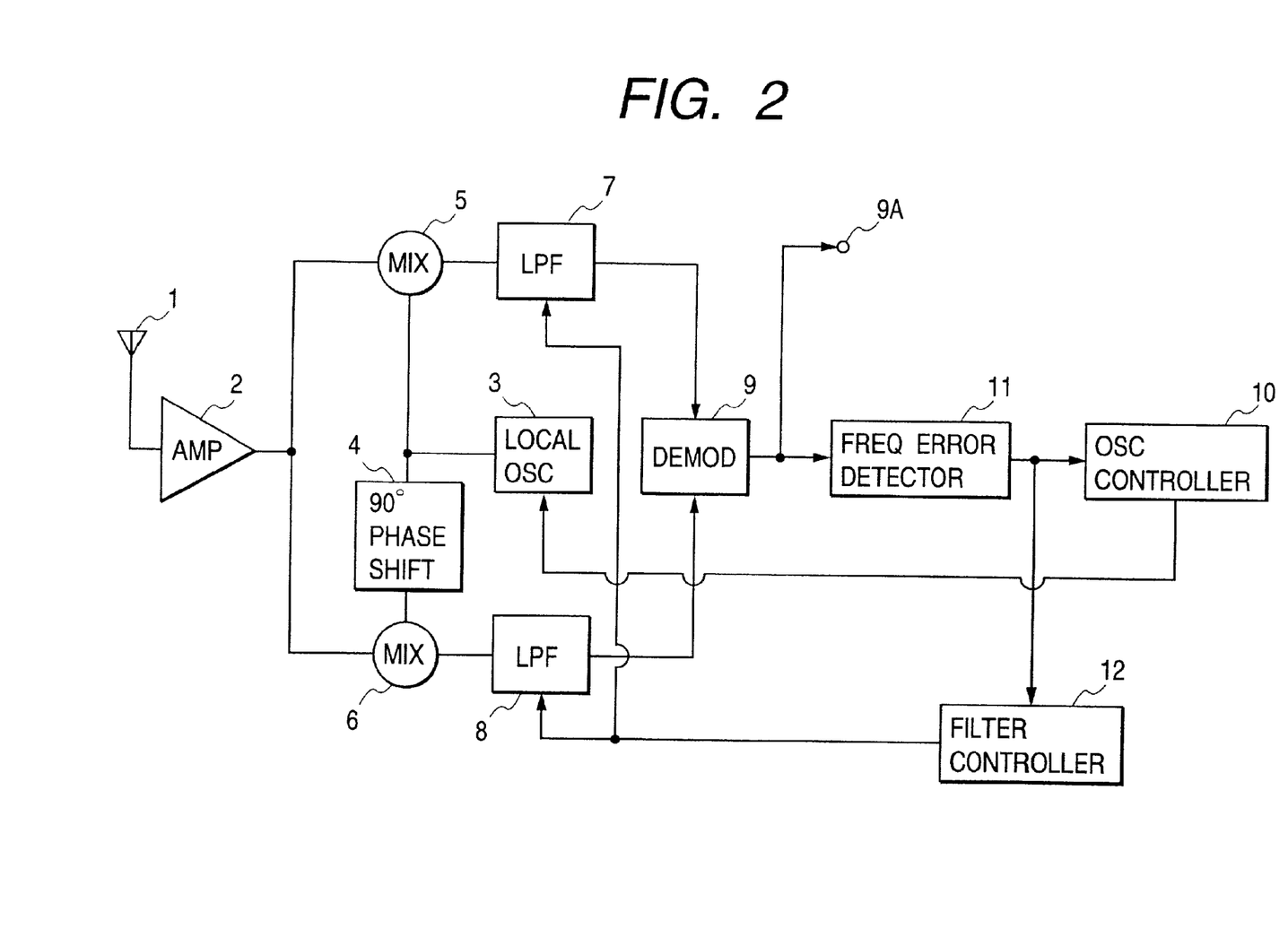
FIG. 2 is a block diagram of a direct conversion receiver according to a first embodiment of this invention.

FIG. 2 shows a direct conversion receiver according to a first embodiment of this invention. The direct conversion receiver of FIG. 2 includes an antenna 1 for receiving an RF FSK signal which carries a digital information signal. The antenna 1 is followed by an RF amplifier 2. The received RF FSK signal is fed from the antenna 1 to mixers 5 and 6 via the RF amplifier 2.

A local oscillator 3 including a variable-frequency oscillator outputs a signal having a frequency, which is automatically controlled at the carrier frequency (the center frequency) of the received RF FSK signal as will be made clear later. The output signal of the local oscillator 3 is applied to the mixer 5 as a first local oscillator signal. The output signal of the local oscillator 3 is also applied to a 90° phase shifter 4, being converted thereby into a 90° phase shifted signal. Thus, the output signal of the local oscillator 3 and the output signal of the 90° phase shifter 4 have a quadrature relation with each other. The output signal of the 90° phase shifter 4 is applied to the mixer 6 as a second local oscillator signal which is quadrature with respect to the first local oscillator signal.

The mixer 5 down-converts the received RF FSK signal in response to the first local oscillator signal, that is, the output signal of the local oscillator 3. The output signal of the mixer 5 is processed by a low pass filter 7, being converted thereby into a baseband I (in-phase) signal. The low pass filter 7 has a variable cutoff frequency.

The mixer 6 down-converts the received RF FSK signal in response to the second local oscillator signal, that is, the output signal of the 90° phase shifter 4. The output signal of the mixer 6 is processed by a low pass filter 8, being converted thereby into a baseband Q (quadrature) signal. The low pass filter 8 has a variable cutoff frequency.

A demodulator 9 receives the baseband I signal and the baseband Q signal from the low pass filters 7 and 8. The demodulator 9 implements demodulation responsive to the baseband I signal and the baseband Q signal. Thus, the demodulator 9 generates a demodulation-resultant signal from the baseband I signal and the baseband Q signal. Normally, the demodulation-resultant signal agrees with the digital information signal represented by the received RF FSK signal. The demodulation-resultant signal is transmitted from the demodulator 9 to an external device (not shown) via an output terminal 9A. Also, the demodulator 9 feeds the demodulation-resultant signal to a frequency error detector 11.

The device 11 detects an error between the carrier frequency (the center frequency) of the received RF FSK signal and the frequency of the first and second local oscillator signals which are applied to the mixers 5 and 6. The frequency error detector 11 generates a signal representing the detected frequency error. The frequency error detector 11 outputs the frequency error signal to an oscillator controller 10 and a filter controller 12.

The oscillator controller 10 generates an oscillator control signal in response to the frequency error signal. The oscillator control signal depends on the frequency error detected by the frequency error detector 11. The oscillator controller 10 outputs the oscillator control signal to the local oscillator 3. The frequency of the output signal of the local oscillator 3, that is, the frequency of the first local oscillator signal, is controlled in response to the oscillator control signal. This frequency control is designed to nullify the frequency error. Thus, the frequency of the first local oscillator signal is automatically controlled to follow the carrier frequency (the center frequency) of the received RF FSK signal. In addition, the frequency of the second local oscillator signal, that is, the frequency of the output signal of the 90° phase shifter 4, is automatically controlled to follow the carrier frequency (the center frequency) of the received RF FSK signal.

Specifically, the local oscillator 3 includes a voltage controlled oscillator generating the first local oscillator signal. The oscillator control signal generated by the oscillator controller 10 has a voltage depending on the frequency error detected by the frequency error detector 11. The oscillator controller 10 applies the oscillator control signal to the control terminal of the voltage controlled oscillator in the local oscillator 3. Accordingly, the frequency of the first local oscillator signal is controlled in response to the oscillator control signal.

The filter controller 12 generates a filter control signal in response to the frequency error signal. The filter control signal depends on the frequency error detected by the frequency error detector 11. The filter controller 12 outputs the filter control signal to the low pass filters 7 and 8. The cutoff frequencies of the low pass filters 7 and 8 are controlled in response to the filter control signal. This cutoff frequency control is designed so that the cutoff frequencies will rise as the frequency error increases. Accordingly, even in the case where the frequency error between the carrier frequency of the received RF FSK signal and the frequency of the first and second local oscillator signals is relatively great, the low pass filters 7 and 8 are prevented from blocking signal components representing the digital information signal. In addition, the low pass filters 7 and 8 are prevented from disabling the automatic frequency control implemented by the combination of the local oscillator 3, the oscillator controller 10, and the frequency error detector 11.

Figure 3:
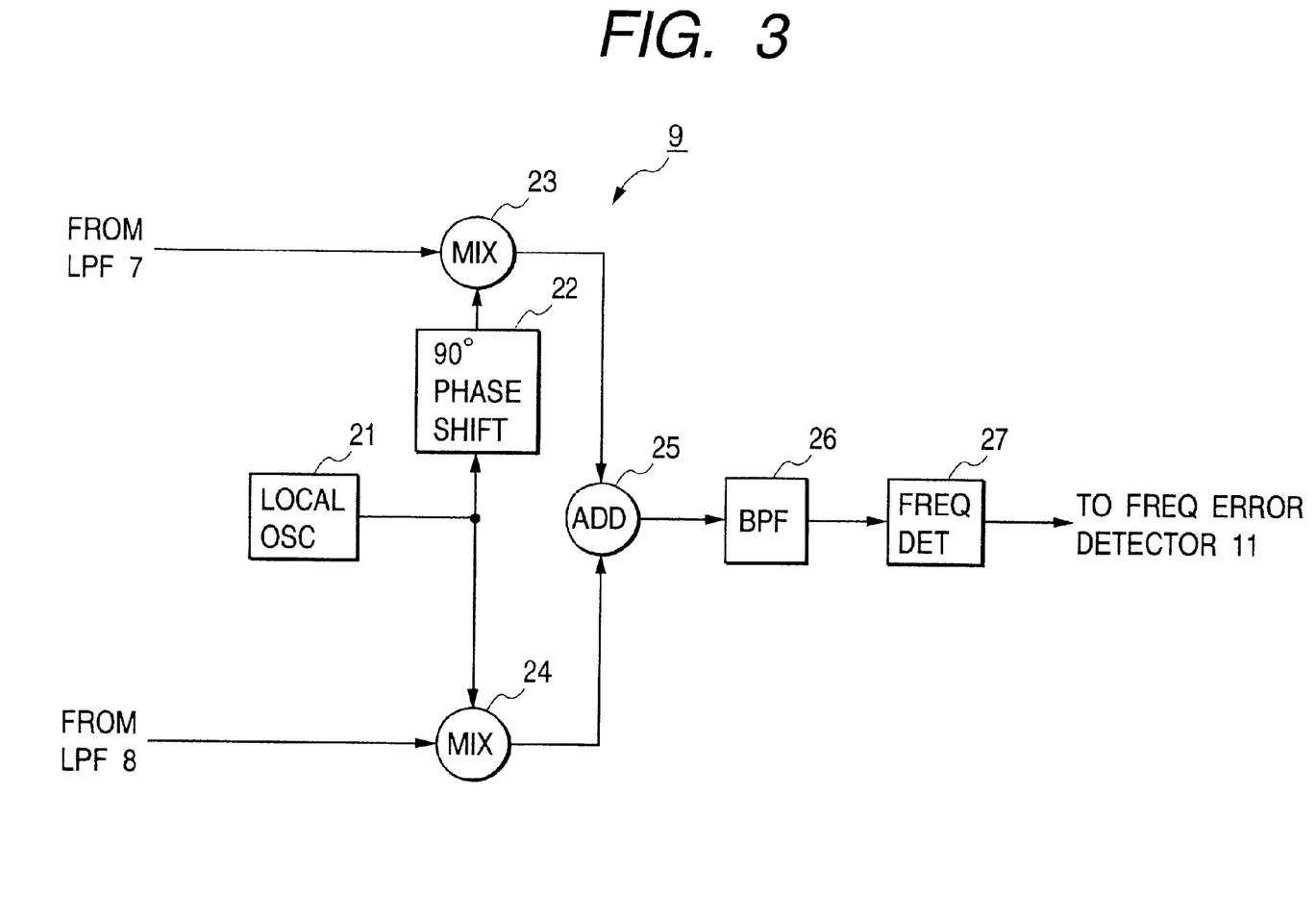
FIG. 3 is a block diagram of an example of a demodulator in FIG. 2.

FIG. 3 shows an example of the structure of the demodulator 9. The demodulator 9 in FIG. 3 includes a local oscillator 21, a 90° phase shifter 22, mixers 23 and 24, an adder 25, a band pass filter 26, and a frequency detector 27.

The mixer 23 receives the baseband I signal from the low pass filter 7 (see FIG. 2). The mixer 24 receives the baseband Q signal from the low pass filter 8 (see FIG. 2). The local oscillator 21 outputs a signal having a predetermined fixed frequency considerably lower than the frequency of the first and second local oscillator signals applied to the mixers 5 and 6 (see FIG. 2). The output signal of the local oscillator 21 is applied to the mixer 24 as a third local oscillator signal. The output signal of the local oscillator 21 is also applied to the 90° phase shifter 22, being converted thereby into a 90° phase shifted signal. Thus, the output signal of the local oscillator 21 and the output signal of the 90° phase shifter 22 have a quadrature relation with each other. The output signal of the 90° phase shifter 22 is applied to the mixer 23 as a fourth local oscillator signal which is quadrature with respect to the third local oscillator signal.

The device 23 mixes the baseband I signal and the fourth local oscillator signal (the output signal of the 90° phase shifter 22). The mixer 23 outputs the mix-resultant signal to the adder 25. The device 24 mixes the baseband Q signal and the third local oscillator signal (the output signal of the local oscillator 21). The mixer 24 outputs the mix-resultant signal to the adder 25. The adder 25 combines the output signals of the mixers 23 and 24 into an FSK signal. Normally, the center frequency of the FSK signal generated by the adder 25 is equal to the frequency of the third and fourth local oscillator signals applied to the mixers 23 and 24. The FSK signal generated by the adder 25 contains the digital information signal. The FSK signal is transmitted from the adder 25 to the frequency detector 27 via the band pass filter 26. The passband of the band pass filter 26 is designed to match the frequencies of FSK signal components representing the digital information signal. The frequency detector 27 subjects the FSK signal to a frequency detection process such as a pulse counting detection process or a quadrature detection process. Thus, the device 27 detects the frequency of the FSK signal. The frequency detector 27 converts the FSK signal into a bi-level signal (a binary signal) which normally agrees with the digital information signal. The frequency detector 27 feeds the bi-level signal to the output terminal 9A and the frequency error detector 11 (see FIG. 2) as the demodulation-resultant signal.

Figure 4:
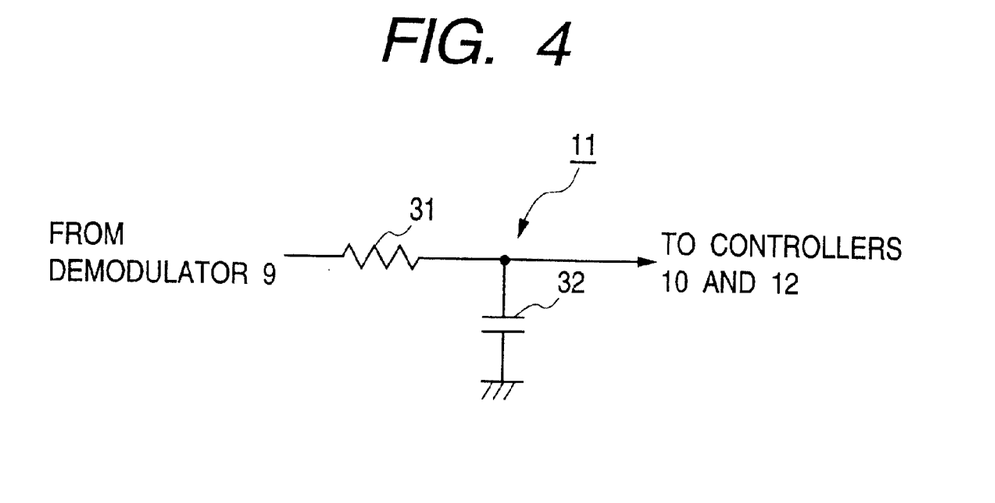
FIG. 4 is a schematic diagram of a first example of a frequency error detector in FIG. 2.

FIG. 4 shows a first example of the structure of the frequency error detector 11. The frequency error detector 11 in FIG. 4 includes a resistor 31 and a capacitor 32. One end of the resistor 31 is connected to the output terminal of the demodulator 9 (see FIG. 2). The other end of the resistor 31 is connected to one end of the capacitor 32. The other end of the capacitor 32 is grounded. The junction between the resistor 31 and the capacitor 32 is connected to the input terminals of the oscillator controller 10 and the filter controller 12 (see FIG. 2). The resistor 31 and the capacitor 32 are combined to form an integrator operating on the demodulation-resultant signal, that is, the output signal of the demodulator 9 (see FIG. 2). The integrator has a predetermined time constant which is sufficiently greater than a value corresponding to the transmission data rate related to the modulation-resultant signal. The demodulation-resultant signal, that is, the output signal of the demodulator 9 (see FIG. 2), has characteristics such that the result of its average in time domain depends on the error between the carrier frequency of the received RF FSK signal and the frequency of the first and second local oscillator signals applied to the mixers 5 and 6 (see FIG. 2). The frequency error detector 11 in FIG. 4 integrates or smooths the demodulation-resultant signal, that is, the output signal of the demodulator 9 (see FIG. 2), and thereby generates a signal whose voltage depends on the previously-mentioned frequency error. This voltage signal appears at the junction between the resistor 31 and the capacitor 32. The voltage signal is transmitted to the oscillator controller 10 and the filter controller 12 (see FIG. 2) as the frequency error signal.

Figure 5:
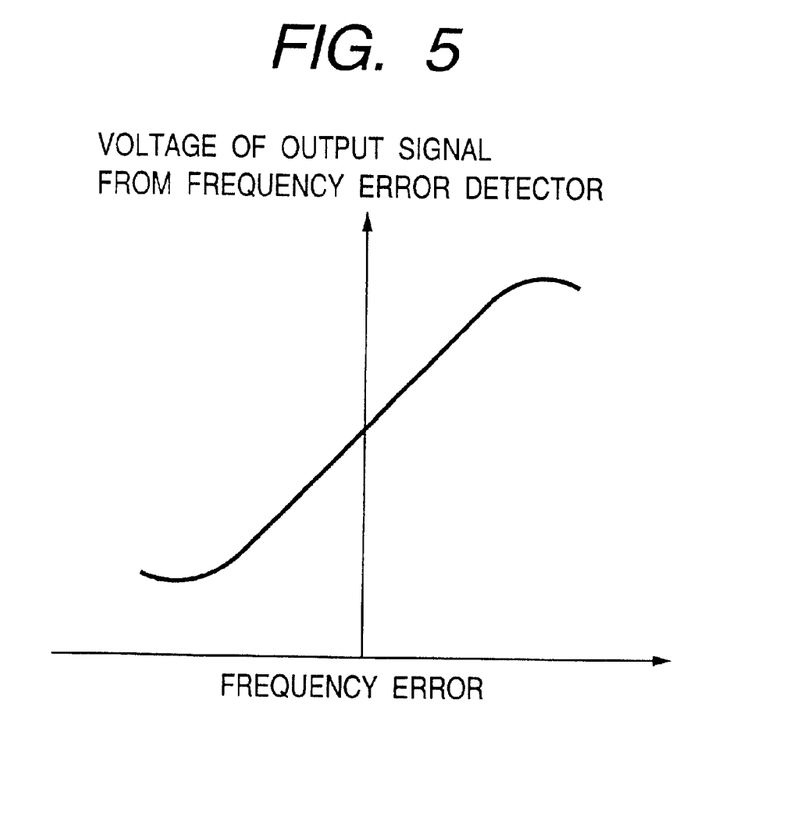
FIG. 5 is a diagram of the relation between a frequency error and the voltage of an output signal from the frequency error detector in FIG. 4.

With reference to FIG. 5, the voltage of the output signal from the frequency error detector 1 in FIG. 4 increases in proportion to the frequency error provided that the frequency error is in a given range.

Figure 6:
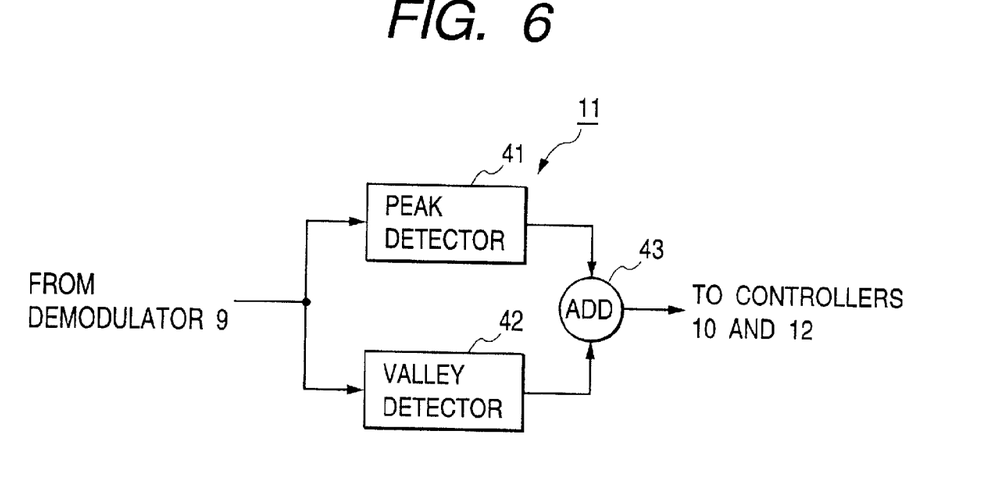
FIG. 6 is a block diagram of a second example of the frequency error detector in FIG. 2.

FIG. 6 shows a second example of the structure of the frequency error detector 11. The frequency error detector 11 in FIG. 6 includes a peak detector 41, a valley detector 42, and an adder 43. The peak detector 41 and the valley detector 42 receive the demodulation-resultant signal, that is, the output signal of the demodulator 9 (see FIG. 2). The device 41 detects the peak voltage of the demodulation-resultant signal in every given time interval sufficiently longer than a period corresponding to the transmission data rate related to the modulation-resultant signal. The peak detector 41 outputs the detected peak voltage to the adder 43. The device 42 detects the valley voltage of the demodulation-resultant signal in every given time interval. The valley detector 42 outputs the detected valley voltage to the adder 43. The adder 43 combines the peak voltage and the valley voltage into a signal whose voltage depends on the error between the carrier frequency of the received RF FSK signal and the frequency of the first and second local oscillator signals applied to the mixers 5 and 6 (see FIG. 2). The adder 43 outputs the voltage signal to the oscillator controller 10 and the filter controller 12 (see FIG. 2) as the frequency error signal.

Figure 7:
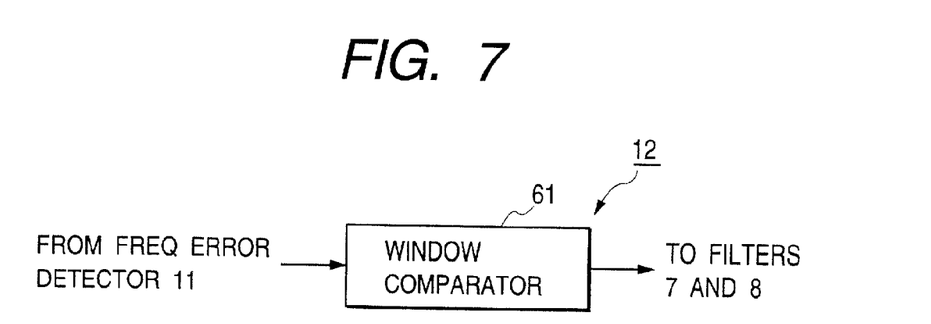
FIG. 7 is a block diagram of a first example of a filter controller in FIG. 2.

FIG. 7 shows a first example of the structure of the filter controller 12. The filter controller 12 in FIG. 7 includes a window comparator 61 which receives the frequency error signal from the frequency error detector 11 (see FIG. 2). The device 61 compares the voltage of the frequency error signal with two reference voltages defining a predetermined window range. When the voltage of the frequency error signal is in the predetermined window range, that is, when the frequency error is in a given range, the window comparator 61 outputs a high-level signal to the low pass filters 7 and 8 (see FIG. 2) as the filter control signal. When the voltage of the frequency error signal is outside the predetermined window range, that is, when the frequency error is outside the given range, the window comparator 61 outputs a low-level signal to the low pass filters 7 and 8 (see FIG. 2) as the filter control signal. The low pass filters 7 and 8 (see FIG. 2) are similar in structure to each other. The cutoff frequency of the low pass filters 7 and 8 (see FIG. 2) is changed between a lower value and a higher value in response to the filter control signal fed from the filter controller 12 in FIG. 7. Specifically, the cutoff frequency of the low pass filters 7 and 8 (see FIG. 2) is equal to the higher value when the filter control signal is in its low-level state, that is, when the frequency error is outside the given range. The cutoff frequency of the low pass filters 7 and 8 (see FIG. 2) is equal to the lower value when the filter control signal is in its high-level state, that is, when the frequency error is in the given range.

The filter controller 12 may include different window comparators operating on the frequency error signal. In this case, the output signals of the window comparators are combined into a multiple-bit filter control signal by a suitable circuit such as a logic circuit including AND gates and OR gates. In addition, the cutoff frequency of the low pass filters 7 and 8 (see FIG. 2) is changed among three or more different values in response to the multiple-bit filter control signal. Thus, in this case, the cutoff frequency of the low pass filters 7 and 8 (see FIG. 2) is changed among three or more different values in response to the frequency error represented by the frequency error signal.

Figure 8:
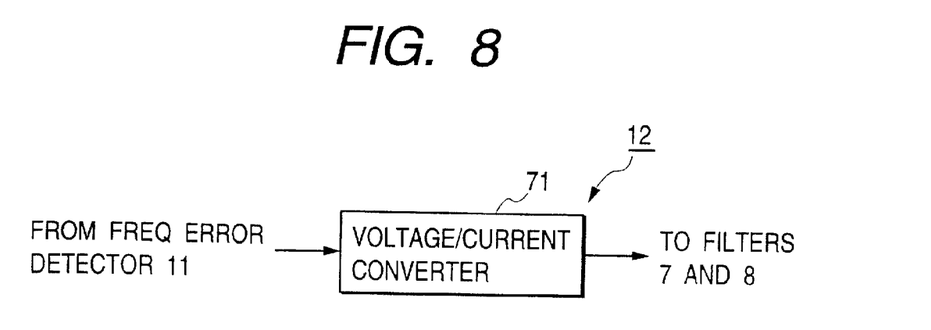
FIG. 8 is a block diagram of a second example of the filer controller in FIG. 2.

FIG. 8 shows a second example of the structure of the filter controller 12. The filter controller 12 in FIG. 8 includes a voltage-to-current converter 71 which receives the frequency error signal from the frequency error detector 11 (see FIG. 2). The device 71 converts the frequency error signal into a signal having a current which is proportional to the voltage of the frequency error signal. The voltage-to-current converter 71 outputs the current signal to the low pass filters 7 and 8 (see FIG. 2) as the filter control signal. In this case, the cutoff frequency of the low pass filters 7 and 8 (see FIG. 2) is continuously varied in response to the filter control signal. Thus, the cutoff frequency of the low pass filters 7 and 8 (see FIG. 2) is continuously varied in accordance with the frequency error represented by the frequency error signal.

With reference back to FIG. 2, the low pass filters 7 and 8 are similar in structure to each other. Only the low pass filter 7 will be explained in detail hereinafter.

Figure 9:
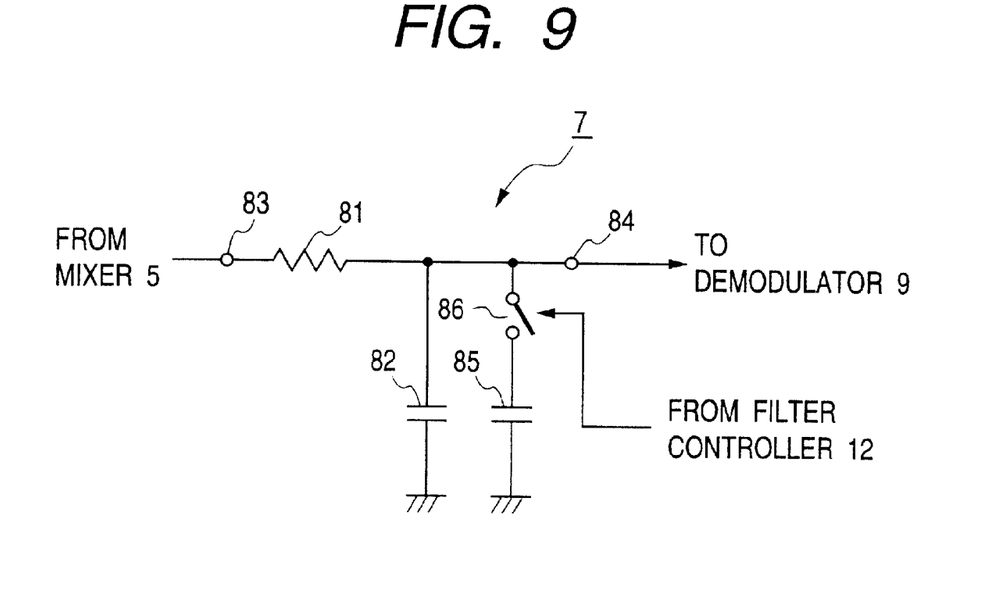
FIG. 9 is a schematic diagram of a first example of a low pass filter in FIG. 2.

FIG. 9 shows a first example of the structure of the low pass filter 7. The low pass filter 7 in FIG. 9 is combined with the filter controller 12 in FIG. 7. The low pass filter 7 in FIG. 9 includes a resistor 81, a capacitor 82, an input terminal 83, an output terminal 84, a capacitor 85, and a switch 86. One end of the resistor 81 is connected to the output terminal of the mixer 5 (see FIG. 2) via the filter input terminal 83. The other end of the resistor 81 is connected to one end of the capacitor 82, and is also connected via the switch 86 to one end of the capacitor 85. The other ends of the capacitors 82 and 85 are grounded. The junction among the resistor 81, the capacitor 82, and the switch 86 is connected to the filter output terminal 84. The filter output terminal 84 is connected to the demodulator 9 (see FIG. 2). A control terminal of the switch 86 is subjected to the filter control signal outputted from the filter controller 12 in FIG. 7. The switch 86 is changed between an on state and an off state in response to the filter control signal. Specifically, the switch 86 is changed to its on state when the filter control signal assumes its high-level state. The switch 86 is changed to its off state when the filter control signal assumes its low-level state. When the switch 86 changes to its on state, the capacitor 85 is connected in parallel with the capacitor 82 so that the cutoff frequency of the low pass filter 7 in FIG. 9 assumes the lower value. When the switch 86 changes to its off state, the capacitor 85 is disconnected from the capacitor 82 so that the cutoff frequency of the low pass filter 7 in FIG. 9 assumes the higher value.

It should be noted that the connection and disconnection of the capacitor 85 to and from the capacitor 82 may be replaced by a change of the resistance of the resistor 81 in response to the switch control signal.

Figure 10:
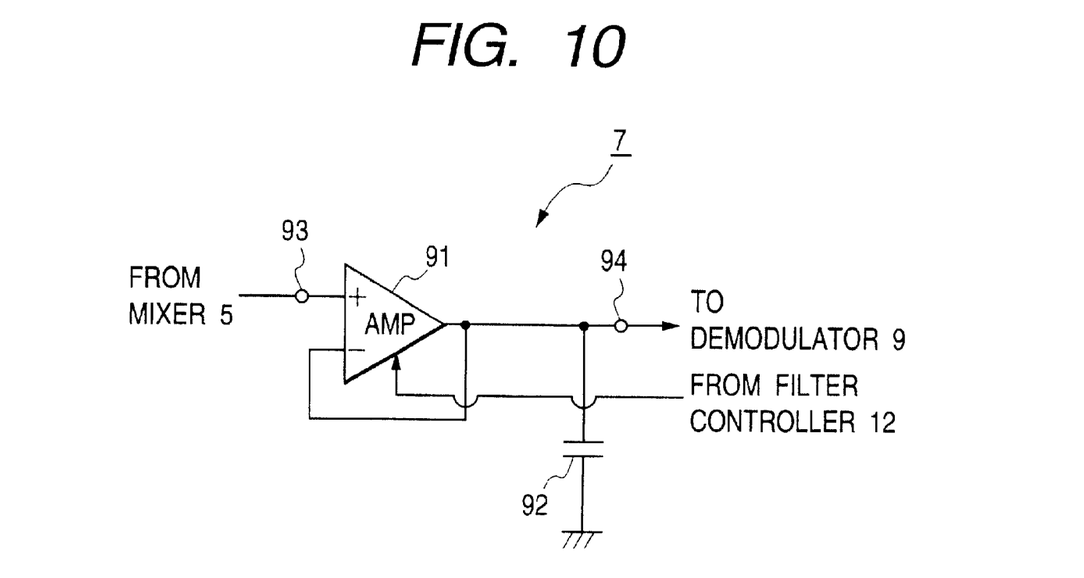
FIG. 10 is a diagram of a second example of the low pass filter in FIG. 2.

FIG. 10 shows a second example of the structure of the low pass filter 7. The low pass filter 7 in FIG. 10 is combined with the filter controller 12 in FIG. 8. The low pass filter 7 in FIG. 10 includes a differential amplifier 91, a capacitor 92, an input terminal 93, and an output terminal 94. The differential amplifier 91 forms a "gm" amplifier. The non-inverting input terminal of the differential amplifier 91 is connected to the output terminal of the mixer 5 (see FIG. 2) via the filter input terminal 93. The inverting input terminal of the differential amplifier 91 is connected to the output terminal thereof. The output terminal of the differential amplifier 91 is connected to one end of the capacitor 92. The other end of the capacitor 92 is grounded. The junction between the output terminal of the differential amplifier 91 and the capacitor 92 is connected to the filter output terminal 94. The filter output terminal 94 is connected to the demodulator 9 (see FIG. 2). A control terminal of the differential amplifier 91 is subjected to the filter control signal outputted from the filter controller 12 in FIG. 8. The differential amplifier 91 forms a resistor, the resistance of which is continuously varied in accordance with the filter control signal. Thus, the cutoff frequency of the low pass filter 7 in FIG. 10 is continuously varied in accordance with the frequency error detected by the frequency error detector 11 (see FIG. 2). Specifically, a collector current which flows in the differential amplifier 91 depends on the filter control signal. Therefore, the conductance "gm" of the differential amplifier 91 depends on the filter control signal.

Second Embodiment

Figure 11:
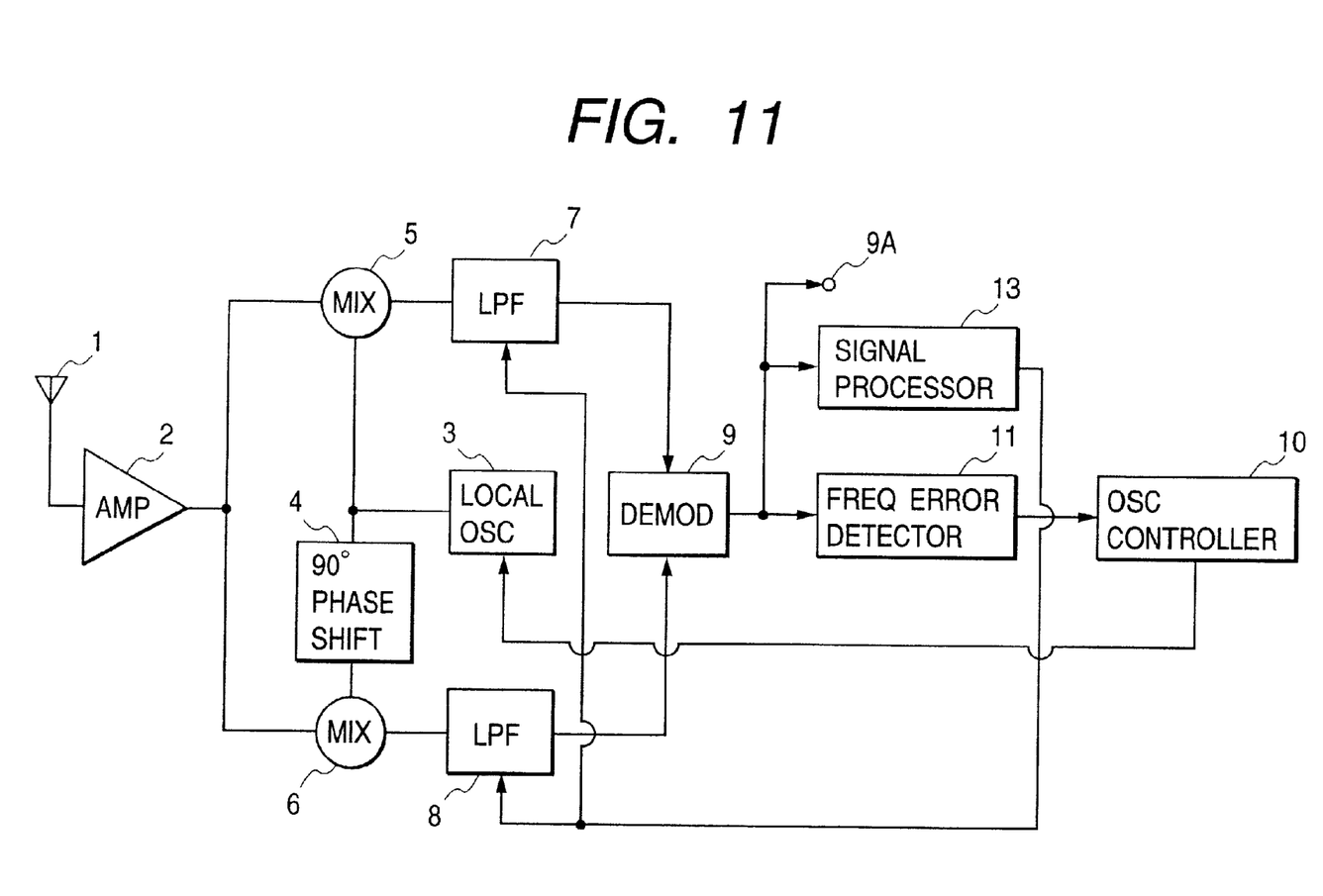
FIG. 11 is a block diagram of a direct conversion receiver according to a second embodiment of this invention.

FIG. 11 shows a direct conversion receiver according to a second embodiment of this invention. The direct conversion receiver of FIG. 11 is similar to the direct conversion receiver of FIG. 2 except for design changes indicated hereinafter. The direct conversion receiver of FIG. 11 is suited for a multiple-value FSK signal such as a 4-value FSK signal.

The direct conversion receiver of FIG. 11 includes a signal processor 13 which receives the demodulation-resultant signal from the demodulator 9. The signal processor 13 includes a microcomputer which is programmed to implement signal pattern recognition.

Specifically, the signal processor 13 senses a given signal pattern (a given symbol pattern) in the demodulation-resultant signal. The signal processor 13 decides whether the given signal pattern is present in or absent from the demodulation-resultant signal. The signal processor 13 generates a binary signal depending on the result of the decision. The signal processor 13 outputs the binary signal to the low pass filters 7 and 8 as the filter control signal. Accordingly, the cutoff frequency of the low pass filters 7 and 8 are changed in response to whether the given signal pattern is present in or absent from the demodulation-resultant signal.

The direct conversion receiver of FIG. 11 uses the low pass filter 7 in FIG. 9. In the direct conversion receiver of FIG. 11, the low pass filter 8 is similar in structure to the low pass filter 7.

Figure 12:
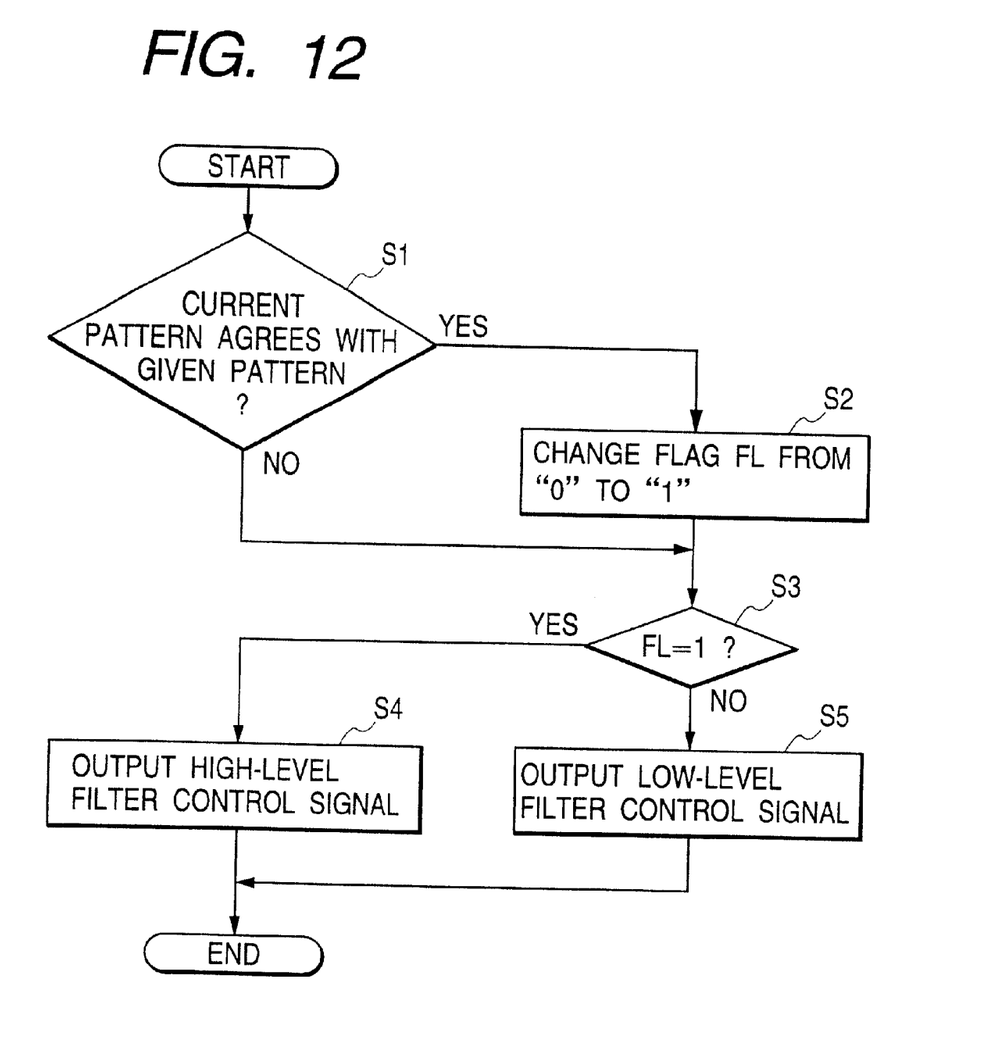
FIG. 12 is a flowchart of a portion of a control program for a signal processor in FIG. 11.

The microcomputer in the signal processor 13 has a combination of an input/output port, a processing section, a ROM, and a RAM. The microcomputer operates in accordance with a program stored in the ROM. FIG. 12 is a flowchart of a portion of the program which is repetitively executed at a period corresponding to a unit time segment (one symbol) of the demodulation-resultant signal. The repetitive execution of the program portion in FIG. 12 is started when the signal processor 13 detects that the demodulation-resultant signal becomes effective. The repetitive execution of the program portion in FIG. 12 is ended when the signal processor 13 detects that the demodulation-resultant signal becomes ineffective.

With reference to FIG. 12, a first step S1 of the program portion derives information of a current signal pattern of the demodulation-resultant signal. The current signal pattern is represented by a predetermined number of the last and former unit time segments (the last and former symbols) of the demodulation-resultant signal. The step S1 reads out information of a given signal pattern from the ROM. The given signal pattern has a length corresponding to the predetermined number of unit signal time segments (symbols). The step S1 collates the current signal pattern with the given signal pattern. When the step S1 decides that the current signal pattern agrees with the given signal pattern, the program advances from the step S1 to a step S2. When the step S1 decides that the current signal pattern disagrees with the given signal pattern, the program jumps from the step S1 to a step S3.

The step S2 changes a flag FL from "0" to "1". It should be noted that the flag FL has been initialized to "0". After the step S2, the program advances to the step S3.

The step S3 decides whether or not the flag FL is "1". When the flag FL is decided to be "1", the program advances from the step S3 to a step S4. Otherwise, the program advances from the step S3 to a step S5.

The step S4 outputs a high-level signal to the low pass filters 7 and 8 as the filter control signal. After the step S4, the current execution cycle of the program portion ends.

The step S5 outputs a low-level signal to the low pass filters 7 and 8 as the filter control signal. After the step S5, the current execution cycle of the program portion ends.

The flag FL used by the steps S2 and S3 enables the following process. As long as the demodulation-resultant signal remains effective, the high-level filter control signal continues to be outputted to the low pass filters 7 and 8 after the given signal pattern is detected in the demodulation-resultant signal.

For example, the cutoff frequency of the low pass filters 7 and 8 assumes the lower value when the filter control signal is changed to its high-level state. The cutoff frequency of the low pass filters 7 and 8 is equal to the higher value when the filter control signal is in its low-level state.

What is claimed is:

1. A portable radio device comprising a direct conversion receiver, wherein the direct conversion receiver comprises:
   a local oscillator for generating a first local oscillator signal having a variable frequency;
   a 90° phase shifter connected to the local oscillator for shifting a phase of the first local oscillator signal by 90° to convert the first local oscillator signal into a second local oscillator signal;
   a first mixer connected to the local oscillator for mixing a received RF signal and the first local oscillator signal;
   a second mixer connected to the 90° phase shifter for mixing the received RF signal and the second local oscillator signal;
   a first low pass filter connected to the first mixer for processing an output signal of the first mixer, the first low pass filter having a first controllable cutoff frequency;
   a second low pass filter connected to the second mixer for processing an output signal of the second mixer, the second low pass filter having a second controllable cutoff frequency;
   a demodulator connected to the first and second low pass filters for recovering an information signal represented by the received RF signal from output signals of the first and second low pass filters;

a frequency error detector connected to the demodulator for detecting an error between a frequency of a carrier of the received RF signal and the frequency of the first local oscillator signal in response to the information signal recovered by the demodulator;

an oscillator controller connected to the local oscillator and to the frequency error detector for controlling the frequency of the first local oscillator signal in response to the error detected by the frequency error detector; and a filter controller connected to the first and second low pass filters and to the frequency error detector for increasing the first and second cutoff frequencies of the first and second low pass filters as the error detected by the frequency error detector increases;

wherein the frequency error detector comprises:
- means for detecting a maximum voltage of the information signal which occurs during a given time interval longer than a period corresponding to a transmission data rate related to the information signal;
- means for detecting a minimum voltage of the information signal which occurs during the given time interval;
- means for deriving a mean voltage between the detected maximum voltage and the detected minimum voltage, and
- means for outputting a signal representing the derived mean voltage.

2. A portable radio device as recited in claim 1, wherein the frequency error detector comprises an integrator for integrating a voltage of the information signal over a given time interval longer than a period corresponding to a transmission data rate related to the information signal.

3. A portable radio device as recited in claim 1, wherein the filter controller comprises means for changing each of the cutoff frequencies of the first and second low pass filters between at least two different values in response to the error detected by the frequency error detector.

4. A portable radio device as recited in claim 1, wherein the filter controller comprises means for continuously varying the cutoff frequencies of the first and second low pass filters in accordance with the error detected by the frequency error detector.

5. A direct conversion receiver comprising:

a local oscillator for generating a first local oscillator signal having a variable frequency;

a 90° phase shifter connected to the local oscillator for shifting a phase of the first local oscillator signal by 90° to convert the first local oscillator signal into a second local oscillator signal;

a first mixer connected to the local oscillator for mixing a received RF signal and the first local oscillator signal;

a second mixer connected to the 90° phase shifter for mixing the received RF signal and the second local oscillator signal;

a first low pass filter connected to the first mixer for processing an output signal of the first mixer, the first low pass filter having a first controllable cutoff frequency;

a second low pass filter connected to the second mixer for processing an output signal of the second mixer, the second low pass filter having a second controllable cutoff frequency;

a demodulator connected to the first and second low pass filters for recovering an information signal represented by the received RF signal from output signals of the first and second low pass filters;

a frequency error detector connected to the demodulator for detecting an error between a frequency of a carrier of the received RF signal and the frequency of the first local oscillator signal in response to the information signal recovered by the demodulator;

an oscillator controller connected to the local oscillator and to the frequency error detector for controlling the frequency of the first local oscillator signal in response to the error detected by the frequency error detector; and a filter controller connected to the first and second low pass filters and to the frequency error detector for increasing the first and second cutoff frequencies of the first and second low pass filters as the error detected by the frequency error detector increases;

wherein the frequency error detector comprises:
- means for detecting a maximum voltage of the information signal which occurs during a given time interval longer than a period corresponding to a transmission data rate related to the information signal;
- means for detecting a minimum voltage of the information signal which occurs during the given time interval;
- means for deriving a mean voltage between the detected maximum voltage and the detected minimum voltage, and
- means for outputting a signal representing the derived mean voltage.

* * * * *